(12) United States Patent
Chang et al.

(10) Patent No.: US 10,714,376 B2
(45) Date of Patent: Jul. 14, 2020

(54) METHOD OF FORMING SEMICONDUCTOR MATERIAL IN TRENCHES HAVING DIFFERENT WIDTHS, AND RELATED STRUCTURES

(71) Applicant: GLOBALFOUNDRIES INC., Grand Cayman (KY)

(72) Inventors: Chih-Chiang Chang, Clifton Park, NY (US); Haifeng Sheng, Rexford, NY (US); Jiehui Shu, Clifton Park, NY (US); Haigou Huang, Rexford, NY (US); Pei Liu, Rexford, NY (US); Jinping Liu, Ballston Lake, NY (US); Haiting Wang, Clifton Park, NY (US); Daniel J. Jaeger, Saratoga Springs, NY (US)

(73) Assignee: GLOBALFOUNDRIES INC., GRand Cayman (KY)

( * ) Notice: Subject to any disclaimer, the term of this patent is extended or adjusted under 35 U.S.C. 154(b) by 4 days.

(21) Appl. No.: 16/016,910

(22) Filed: Jun. 25, 2018

(65) Prior Publication Data
US 2019/0393077 A1    Dec. 26, 2019

(51) Int. Cl.
| H01L 29/66 | (2006.01) |
| H01L 29/78 | (2006.01) |
| H01L 21/762 | (2006.01) |
| H01L 27/088 | (2006.01) |
| H01L 21/8234 | (2006.01) |
| H01L 21/768 | (2006.01) |

(52) U.S. Cl.
CPC .. *H01L 21/76229* (2013.01); *H01L 21/76816* (2013.01); *H01L 21/823431* (2013.01); *H01L 27/0886* (2013.01); *H01L 29/66545* (2013.01); *H01L 29/66795* (2013.01); *H01L 29/785* (2013.01)

(58) Field of Classification Search
CPC ......... H01L 21/76229; H01L 21/76816; H01L 21/823431; H01L 29/66545; H01L 29/785; H01L 29/66795; H01L 27/0886
See application file for complete search history.

(56) References Cited

U.S. PATENT DOCUMENTS

| 5,035,768 A | 7/1991 | Mu et al. |
| 8,658,541 B2 | 2/2014 | Lee et al. |

(Continued)

*Primary Examiner* — Allen L Parker
*Assistant Examiner* — Gustavo G Ramallo
(74) *Attorney, Agent, or Firm* — Francois Pagette; Hoffman Warnick LLC

(57) ABSTRACT

The present disclosure relates to methods for forming fill materials in trenches having different widths and related structures. A method may include: forming a first fill material in a first and second trench where the second trench has a greater width than the first trench; removing a portion of the first fill material from each trench and forming a second fill material over the first fill material; removing a portion of the first and second fill material within the second trench; and forming a third fill material in the second trench. The structure may include a first fill material in trenches having different widths wherein the upper surfaces of the first fill material in each trench are substantially co-planar. The structure may also include a second fill material on the first fill material in each trench, the second fill material having a substantially equal thickness in each trench.

14 Claims, 4 Drawing Sheets

(56) References Cited

U.S. PATENT DOCUMENTS

| | | |
|---|---|---|
| 8,765,491 B2 | 7/2014 | Cai et al. |
| 2015/0126012 A1* | 5/2015 | Jeong ................ H01L 29/66628 438/300 |
| 2015/0311208 A1* | 10/2015 | Kim .................. H01L 21/02697 257/369 |
| 2016/0104644 A1* | 4/2016 | Liu ................... H01L 21/82345 257/401 |

* cited by examiner

METHOD OF FORMING SEMICONDUCTOR MATERIAL IN TRENCHES HAVING DIFFERENT WIDTHS, AND RELATED STRUCTURES

BACKGROUND

Technical Field

The present disclosure relates to methods for forming semiconductor material in trenches having different widths, such as for forming replacement metal gate (RMG) structures having different widths. Specifically, a method for uniformly removing material from trenches having different widths, and related integrated circuit (IC) structures are disclosed.

Related Art

Conventional integrated circuits, such as microprocessors, storage devices, etc., include millions of circuit elements including structures such as transistors. Transistors come in a variety of shapes, orientations, and forms, e.g., planar, fin-type, nanowire, etc. Irrespective of the physical configuration of the transistor device, each transistor comprises source/drain regions in a substrate, and a gate structure defining a channel positioned between the source/drain regions. Transistors may be utilized by applying a predetermined control voltage to the gate structure, causing the portion of the channel in contact with the gate structure and between the source/drain regions to become conductive. The transistors are generally either an N-type (NFET) or P-type (PFET) transistor device wherein the "N" and "P" indicate the type of dopants used to create the source/drain regions of the devices.

As discussed above, transistors generally include a gate structure defining a channel positioned between the source/drain regions. Gate structures generally include a gate body including a metal material on the substrate and surrounded by dielectric material to electrically isolate the gate body from other structures. For example, a dielectric material may be formed on the substrate; a trench or opening forming in the dielectric material to expose the substrate; one or more metal materials deposited within the trench; a portion of the metal material recessed; and a dielectric cap formed on top of the metal material(s) such that the metal is contacting the substrate and otherwise surrounded by the dielectric material.

Integrated circuit (IC) structures may include multiple transistor structures and therefore may include multiple adjacent gate structures formed concurrently on the substrate. While some gate structures may include similar dimensions, transistors may require different channel dimensions resulting in adjacent gate structures having different dimensions, such as gate width.

One challenge associated with the fabrication of adjacent gate structures having different dimensions includes the disproportionate effect of processing steps between the adjacent structures having different widths. For example, during the recessing of the metal material of the gate structures, e.g., by etching, a larger amount of the metal material may remain in a trench having a larger width for a larger gate structure as compared to a smaller trench having a smaller width. When the dielectric cap material is then formed over the metal material, there is less room for the dielectric material in the larger trench, causing a thinner cap layer to be formed on the larger gate structure. As a result, the risk of etching through dielectric cap during subsequent processing is greater for the larger gate structure than the adjacent, thinner gate structure.

SUMMARY

A first aspect of the disclosure is directed to a method. The method may include forming a first fill material in a first trench and a second trench, the first and second trench positioned in a dielectric material on a substrate, and a width of the first trench being greater than a width of the second trench; removing a first portion of the first fill material from the first trench and the second trench; forming a second fill material above a remaining portion of the first fill material in the first trench and the second trench such that the second fill material completely fills at least the second trench; removing a first portion of the second fill material in the first trench to expose an upper surface of the remaining portion of the first fill material in the first trench; and removing a portion of the remaining portion of the first fill material in the first trench such that the remaining portion of the first fill material in the first trench includes: a lower region having an uppermost extent that is substantially co-planar with an upper surface of the remaining portion of the first fill material in the second trench, and two upper regions positioned on the lower region.

A second aspect of the disclosure is directed to a method. The method may include providing an integrated circuit structure including: a fin on a substrate, the fin including an upper surface; a dielectric material position on the upper surface of the fin; a first gate structure positioned on the dielectric material and on sidewalls of the fin, wherein the first gate structure includes a gate body surrounded by a gate liner; and a second gate structure positioned on the dielectric material and on the sidewalls of the fin, the second gate structure being laterally separated from the first gate structure and the second gate structure including a gate body surrounded by a gate liner, and wherein a width of the gate body of the first gate structure is greater than a width of the gate body of the second gate structure; removing a first portion of the gate body of the first gate structure and removing a portion of the gate body of the second structure such that an upper surface of a remainder of the gate body of the first gate structure is positioned above an upper surface of a remainder of the gate body of the second gate structure; forming a first cap layer on the remainder of the gate body of the first gate structure and on the remainder of the gate body of the second gate structure, wherein a thickness of the first cap layer is approximately equal to or greater than the width of the gate body of the second gate structure; removing a portion of the first cap layer above the gate body of the first gate structure and above the gate body of the second gate structure such that the remaining portion of the gate body of the first gate structure is exposed, and the remaining portion of the gate body of the second gate structure remains covered by the first cap layer; removing a second portion of the gate body of the first gate structure such that the remainder of the gate body of the first gate structure includes: a lower region having an uppermost extent that is substantially co-planar with an uppermost surface of the remainder of the gate body of the second gate structure; and two upper regions positioned on the lower region, the two upper regions having an uppermost extent that is positioned above the upper surface of the uppermost surface of the remainder of the gate body of the second gate structure; and forming a second cap layer above the remainder of the gate body of the first gate structure.

A third aspect of the disclosure is directed to an integrated circuit (IC) structure. The structure may include a dielectric material positioned above a substrate; a first fill material in a first trench in the dielectric material, the first fill material including: a lower portion; and two upper portions positioned on the lower portion, wherein an uppermost extent of the two upper portions is positioned below an uppermost extent of the first trench; a second fill material in a second trench in the dielectric material, the second fill material laterally separated from the first fill material, and the second fill material having an uppermost extent positioned below an uppermost extent of the second trench, wherein a width of the lower portion of the first fill material is greater than a width of the second fill material, and wherein the upper surface of the lower portion of the first fill material is substantially co-planar with the uppermost extent of the second fill material; a third fill material positioned above the first fill material in the first trench; and a fourth fill material positioned above the second fill material in the second trench.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to methods for removing material from trenches having different widths. The methods may, for example, mitigate disproportionate etching of fill materials that generally occurs in trenches having different widths. Specifically, the methods described herein may include removing a portion of a first fill material in at least two trenches, each having different widths; forming a second fill material in the trenches; and removing a portion of the second fill material and another portion of the first fill material from the larger trench so that the upper surfaces of the first fill material in each trench are substantially co-planar. A third fill material that is the same as the second fill material may then be formed on the first fill material in the larger trench resulting in a structure having two trenches of different widths each including a second and/or third fill material having a substantially similar thickness. As will be discussed herein, in the context of replacement metal gate (RMG) structures, the method of the disclosure may mitigate and/or prevent a larger width RMG from having a thinner cap structure than an adjacent, smaller width RMG structure. The method may further prevent and/or mitigate subsequent etching through the cap structure on the larger width RMG structure during processing to expose and electrically short the larger width RMG structure. Although discussed herein with respect to the formation of an RMG structure, it is understood that the method and structure are not limited to that application.

Figure 1:
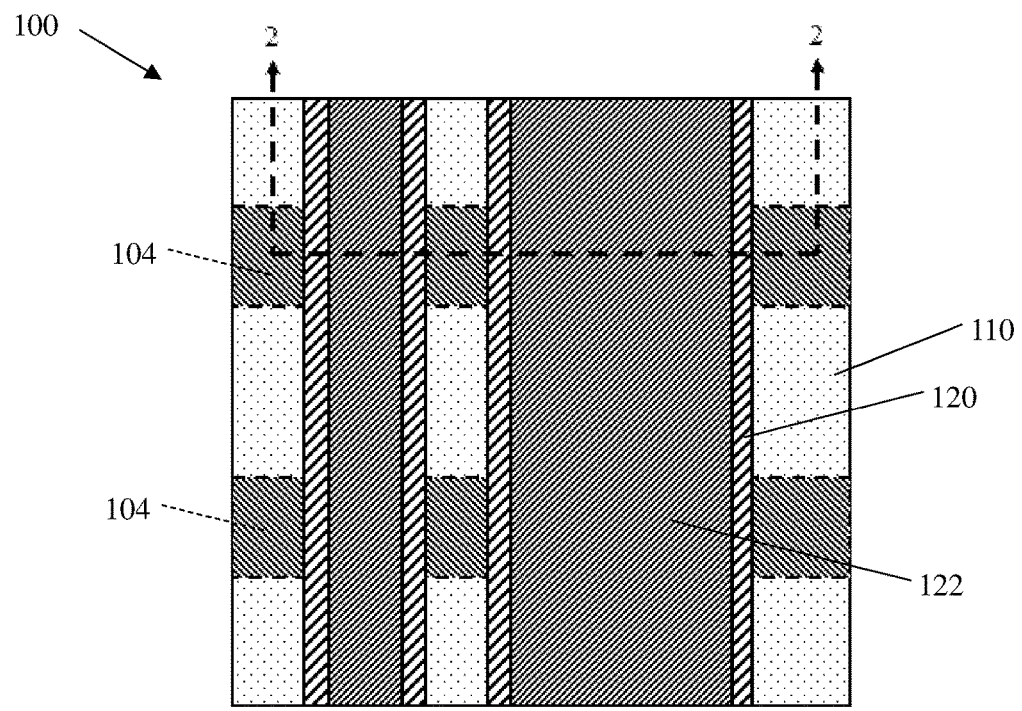
FIG. 1 shows a top-down view of an initial structure, according to embodiments of the disclosure.
Figure 2:
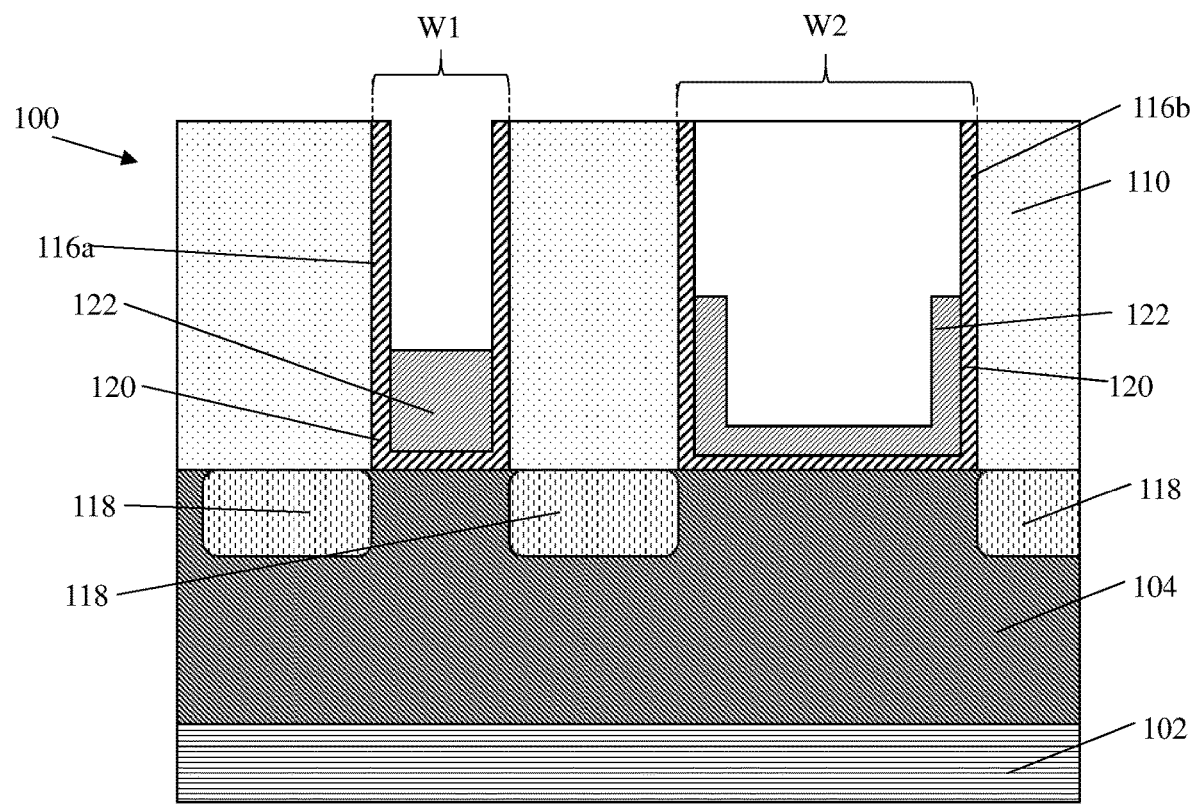
FIG. 2 shows a cross-sectional view of the initial structure at line 2-2 of FIG. 1.

Referring first to FIGS. 1 and 2 together, an initial structure 100 is shown, according to embodiments of the disclosure. FIG. 1 provides a top-down view of the initial structure, and FIG. 2 provides a cross-sectional view of the initial structure at line 2-2 of FIG. 1. It should be understood that the structures shown in FIG. 1 in phantom are positioned under other structures but are shown for purposes of clarity. Additionally, it should be understood that other conventional structures may be missing from FIGS. 1 and 2 for purposes of simplicity in describing embodiments of the disclosure.

Initial structure 100 may include a substrate 102 (FIG. 2 only). Substrate 102 may include any currently-known or later developed material capable of being processed into a transistor structure, and may include, e.g., a bulk semiconductor layer, a semiconductor-on-insulator (SOI) substrate, etc. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained. Substrate 102 of initial structure 100 may be formed by forming a semiconductor material on an underlying structure (not shown). According to an example, substrate 102 can be formed by deposition and/or wafer bonding, e.g., separation by implantation of oxygen (SIMOX).

As shown in FIG. 1, initial structure 100 may also include a plurality of spaced fins 104 (in phantom) over substrate 102 (FIG. 2 only). As will be discussed later herein, fins 104 may be subsequently utilized as a channel of a vertical field effect transistor (VFET) for a semiconductor device. Fins 104 may be formed from substrate 102 by any suitable process including one or more photolithography and etch processes. For example, a mask (not shown) may be patterned on substrate 102, and portions of the substrate not covered by the mask may be etched to form fins 104. Fins 104 may include semiconductor materials, including but not limited to silicon, silicon germanium, and any III—V type material. Initial structure 100 may include fins 104 for different types of transistors, for example, p-type field effect transistors (PFETs) and n-type field effect transistors (NFETs). The "N" and "P" indicate the type of dopants used to create the source/drain regions of the devices. While two fins 104 are shown in the top-down view of FIG. 1, it is to be understood that any number of fins may be employed without departing from aspects of the disclosure.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Initial structure 100 may also include an interlayer dielectric (ILD) 110 above fin 104 and substrate 102 and also about fin 104, as shown in the cross-section of FIG. 2. ILD 110 may be formed to electrically isolate fins 104 and substrate 102 from other semiconductor structures. The material of ILD 110 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. ILD 110 may be formed by any suitable semiconductor fabrication process. For example, ILD 110 may be formed by deposition.

As used herein, the term "depositing" or "deposition" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As shown in the cross-sectional view of FIG. 2, initial structure 100 may also include two or more trenches 116a,b in ILD 110 on fin 104. Trenches 116a,b may be subsequently filled to form replacement metal gate (RMG) structures over fins 104. As also shown in FIG. 2, first trench 116a may have a smaller width W1 as compared to the width W2 of second trench 116b. Trenches 116a,b may have different widths, for example, to allow for RMG structures of different widths to be formed for transistor channels of different lengths. Trenches 116a,b may be formed within ILD 110 by patterned etching using a mask (not shown). Although two trenches are shown in the cross-sectional view of FIG. 2, it is understood that any number of trenches for any number of RMG structures may be formed.

Although not shown, trenches 116a,b may be temporarily filled with a sacrificial material during subsequent processing of initial structure 100. The sacrificial material may be a placeholder for a later replacement metal gate (RMG) material for forming a RMG structure on fin 104 for a transistor. For example, the sacrificial material may be present within trenches 116a,b during the formation of source/drain regions 118 in substrate 102 for the transistors. The sacrificial material in trenches 116a,b may be referred to as dummy gates. As shown in the cross-section of FIG. 2 initial structure 100 may include source/drain regions 118 formed within substrate 102 below and/or adjacent to each fin 104. Source/drain regions 118 may be formed by conventional semiconductor fabrication techniques for forming a source/drain region. For example, source/drain regions 118 may be formed by etching openings in substrate 102 between fins, and epitaxial growth of a source/drain material in the openings. The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Source/drain regions 118 may be formed as either N-type source/drain regions or P-type source/drain regions. Formation of P-type source/drain regions may include in-situ P-type doping. For example, a P-type dopant is introduced to the substrate 102 to generate free hole (by "accepting" electron from semiconductor atom and "releasing" hole at the same time). The P-type dopants may include without limitation boron (B), indium (In), and gallium (Ga). P-type source/drain regions may include silicon germanium and/or any other now known or later developed stressor for generating compressive stress in the channel of the subsequently formed PFET to enhance the mobility of the holes created by the P-type dopant. N-type source/drain regions may be formed by similar methods as discussed above with respect to P-type source/drain regions, with the exception of source/drain region material, and the dopant used to dope the region. For example, N-type source/drain regions may be formed in substrate 102 by in-situ N-type doping. The N-type dopants may include but are not limited to, for example, phosphorous (P), arsenic (As), antimony (Sb), etc. N-type source/drain regions may include, for example, silicon phosphorus (SiP), and/or any other now known or later developed material for forming an N-type source/drain region.

Figure 3:
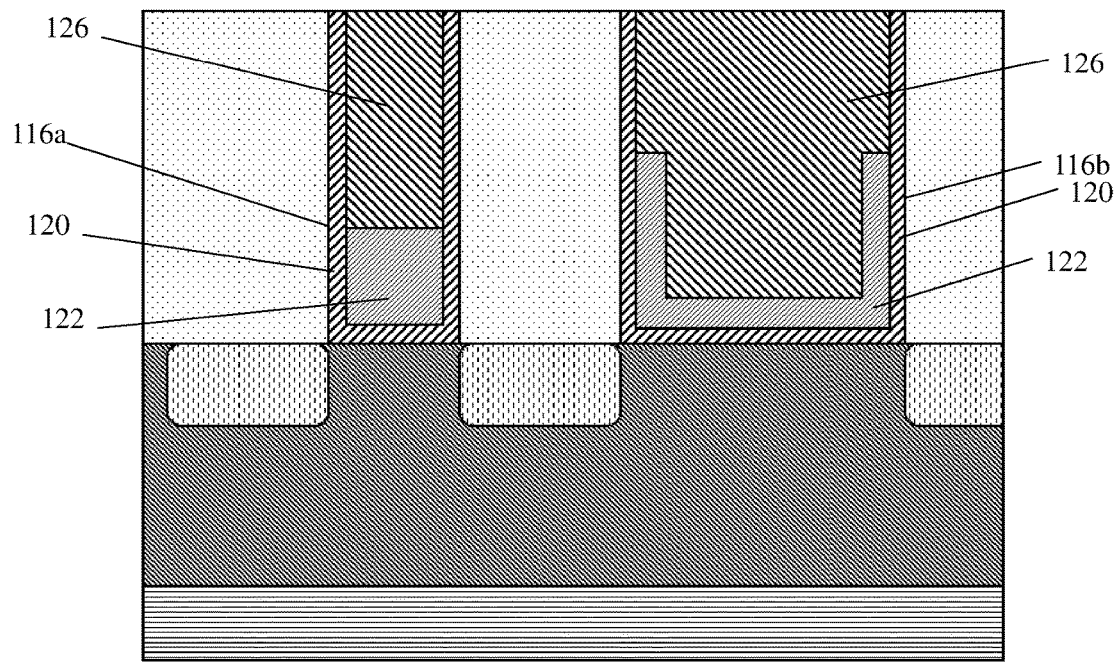
FIG. 3 shows forming first fill material in the trenches of the initial structure of FIG. 2, according to embodiments of the disclosure.

After the additional processing of initial structure 100, e.g., forming source/drain regions 118, the sacrificial material (not shown) may be removed from trenches 116a,b so that the RMG material may be formed therein. For example, the RMG material may include a gate dielectric layer 120, a metal gate material layer 122 and/or tungsten (W) RMG body 126 (FIG. 3). FIGS. 1 and 2 show forming gate dielectric layer 120 within trenches 116a,b after the removal of the sacrificial material. Gate dielectric layer 120 may substantially line trenches 116a,b. Gate dielectric layer 120 may include may include silicon oxide ($SiO_2$), silicon oxynitride (SiON), or high-k dielectric material with a k-value greater than 3.9. For example, where gate dielectric liner 120 includes a high-k dielectric material, the material may include but is not limited to metal oxides such as hafnium oxide ($HfO_2$), zirconium oxide ($ZrO_2$), hafnium aluminum oxide ($HfAlO_x$), hafnium zirconium oxide ($HfZrO_x$), hafnium lanthanum oxide ($HfLaO_x$), tantalum oxide ($Ta_2O_5$), barium titanium oxide ($BaTiO_3$), aluminum oxide ($Al_2O_3$), or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate dielectric layer 120 may be formed by any suitable semiconductor fabrication process such as conformal deposition. As used herein, the term "conformal deposition" may include a deposition process wherein the material formed by the process has a substantially consistent thickness.

FIGS. 1 and 2 also show forming metal gate material layer 122 for a RMG structure in trenches 116a,b after the formation of gate dielectric layer 120. With regard to RMG processing, metal gate material layer 122 is referred to as a work function metal (WFM) layer, and may include a work function metal to tailor the performance of a particular type of FET, such as but not limited to: titanium carbide (TiC), titanium alumnide (TiAl), titanium aluminum carbide (TiAlC), tantalum nitride (TaN), tantalum carbide (TaC), or any other suitable metal or alloy. Metal gate material layer 122 may be formed within trenches 116a,b by any suitable semiconductor fabrication process. For example, metal gate material layer 122 may be formed by deposition. As shown in the cross-section of FIG. 2, metal gate material layer 122 within first trench 116a may include a substantially square or substantially rectangular cross-sectional geometry. In contrast, since second trench 116b includes a larger width W2 as compared to first trench 116a, metal gate material layer 122 formed in second trench 116b may include a substantially U-shaped cross-sectional geometry. For example, the process used to form metal gate material layer 122 in first trench 116a may fill less of larger second trench 116b resulting in metal gate material layer 122 in second trench 116b having a substantially U-shaped cross-sectional geometry.

Turning next to FIG. 3, a cross-sectional view of forming a replacement metal gate (RMG) body or first fill material 126 in first and second trenches 116a,b is shown, according to embodiments of the disclosure. First fill material 126 may be formed in trenches 116a,b on metal gate material layer 122 and gate dielectric layer 120. For example, first fill material 126 may include tungsten (W) for a W RMG body of an RMG structure. Although discussed herein with respect to a RMG structure for a transistor, it is understood that the methods discussed herein may be applicable to any desirable semiconductor fill material formed within openings having different dimensions. First fill material 126 may be formed by any suitable process such as deposition, and chemical mechanical planarization (CMP).

Figure 4:
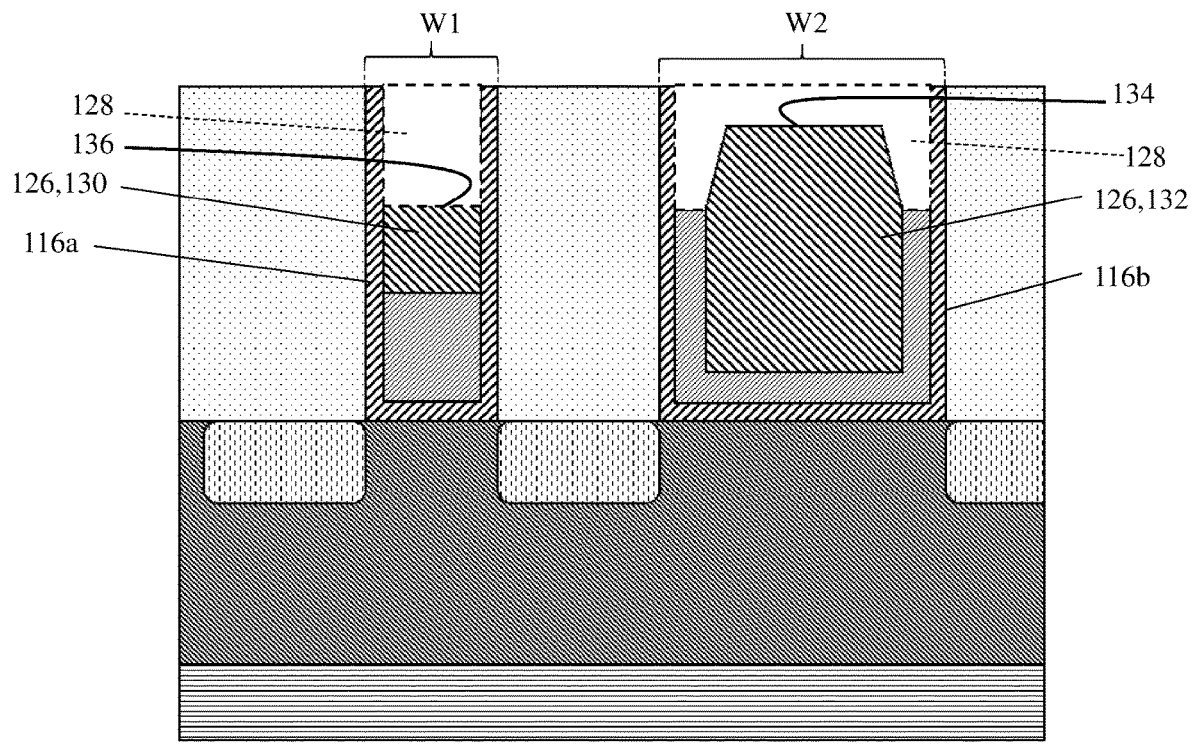
FIG. 4 shows removing a portion of the first fill material from the trenches of FIG. 3, according to embodiments of the disclosure.

Turning to FIG. 4, a portion 128 (in phantom) of first fill material 126 may be removed from within trenches 116a,b. Portion 128 (in phantom) of first fill material 126 may be removed to provide space for a cap or second fill material 140 (FIG. 5) to be formed on first fill material 126 within trenches 116a,b, as will be discussed in greater detail later herein. Portion 128 (in phantom) may be removed by any suitable semiconductor fabrication process such as etching.

As shown in FIG. 4, after removing portion 128 (in phantom), a remainder 130 of first fill material 126 in first trench 116a may have a substantially rectangular cross-sectional geometry. As also shown in FIG. 4, a remainder 132 of first fill material 126 in second trench 116b which has a larger width W2 than first trench 116a may include a portion having a substantially trapezoidal cross-sectional geometry. An upper surface 134 of remainder 132 in second trench 116b may be positioned above an upper surface 136 of remainder 130 in first trench 116a. For example, during the etching process to remove portion 128 (in phantom) there may be a greater quantity of first fill material 126 in larger second trench 116b than in smaller first trench 116a resulting in more of first fill material 126 remaining in second trench 116b after removing portion 128 (in phantom).

Figure 5:
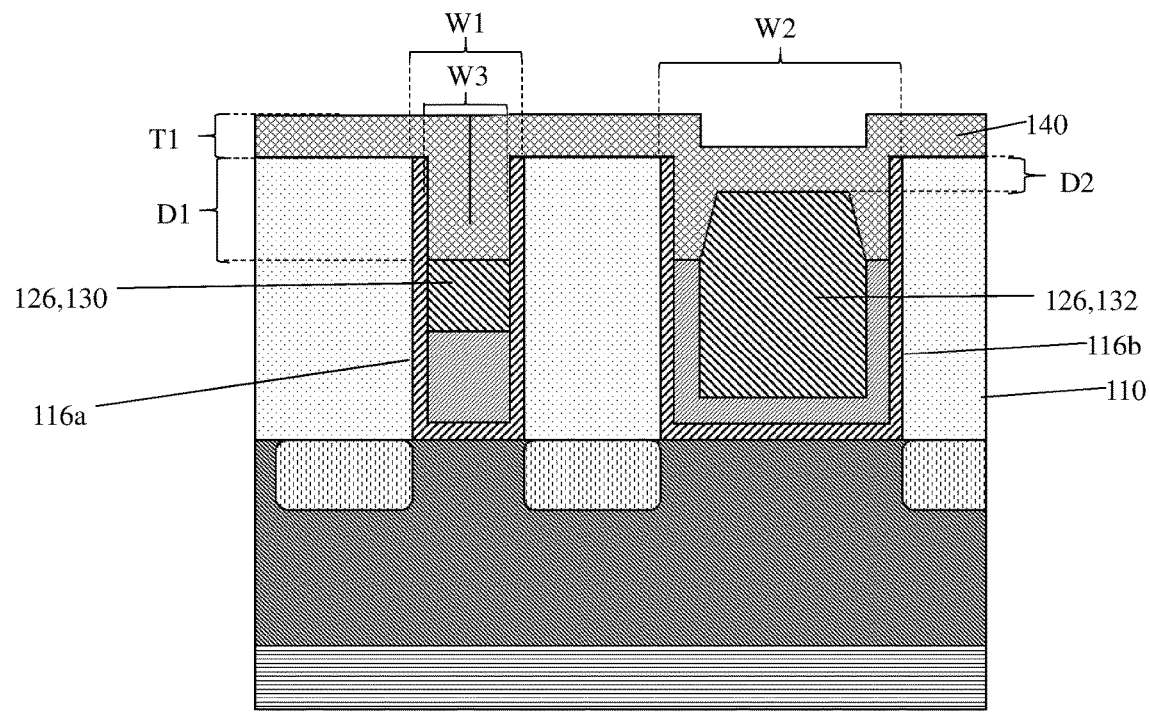
FIG. 5 shows forming a second fill material on the first fill material of FIG. 4, according to embodiments of the disclosure.

Turning next to FIG. 5, cap or second fill material 140 may be formed over remainders 130,132 of first fill material 126 in trenches 116a,b, respectively, and on ILD 110. Second fill material 140 may include a different material than first fill material 126. For example, second fill material 140 may include a cap material for electrically isolating W gate body or first fill material 126. Where second fill material 140 includes a cap material, second fill material 140 may include silicon nitride (SiN) and/or any other suitable material to protect and/or isolate a RMG structure. Although discussed herein with respect to a RMG structure for a transistor, it is understood that second fill material 140 may include any desirable semiconductor fill material different from a first fill material 126, previously formed in the openings. Second fill material 140 may be formed by any suitable process such as deposition.

As shown in FIG. 5, a depth D1 of second fill material 140 on remainder 130 within first trench 116a may be greater than a depth D2 of second fill material 140 on remainder 132 in second trench 116b. For example, since remainder 132 of first fill material 126 in second trench 116b extends higher than remainder 130 of first fill material 126 in first trench 116a, there may be less space within second trench 116b for second fill material 140.

In contrast to conventional processes, second fill material 140 may be formed to have a thickness T1 over ILD 110 equal to at least half of the width W3 of first fill material 126 in first trench 116a. As will be discussed in greater detail later herein, forming second fill material 140 to have thickness T1 over ILD 110 equal to at least half of the width W3 of first fill material 126 in trench 116a may allow for second fill material 140 to fill first trench 116a, and to continue to cover and/or protect remainder 130 of first fill material 126 in first trench 116a after removing a portion of the second fill material during subsequent processing. For example, as shown in FIG. 5, second fill material 140 may completely fill first trench 116a. In another non-limiting example, second fill material 140 may have a thickness over ILD 110 equal to at least half of the width W1 of first trench 116a.

Figure 6:
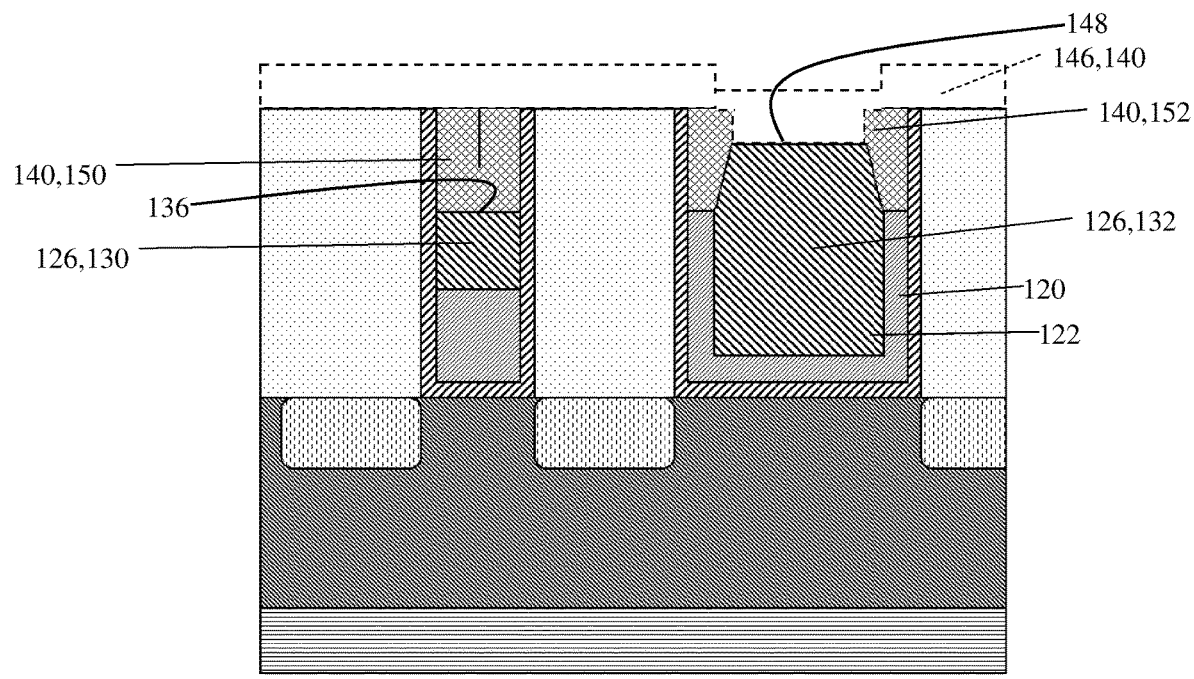
FIG. 6 shows removing a portion of the second fill material and exposing the first fill material in one of the trenches of FIG. 5, according to embodiments of the disclosure.

Turning to FIG. 6, in further contrast to conventional processes, a portion 146 (in phantom) of second fill material 140 may be removed to expose upper surface 148 of remainder 132 of first fill material 126 in second trench 116b. After removing portion 146 (in phantom), a first portion 150 of second fill material 140 may remain above and completely cover remainder 130 of first fill material 126 in first trench 116a. As also shown in FIG. 6, a second portion 152 of second fill material 140 may remain along sidewalls of gate dielectric layer 120 and above metal gate material 122 in second trench 116b. As will be discussed later herein, removing portion 146 (in phantom) to expose upper surface 148 may allow for a portion of remainder 132 to be removed to allow for additional fill material to be formed in second trench 116b. Portion 146 (in phantom) of second fill material 140 may be removed by any suitable process such as etching.

Figure 7:
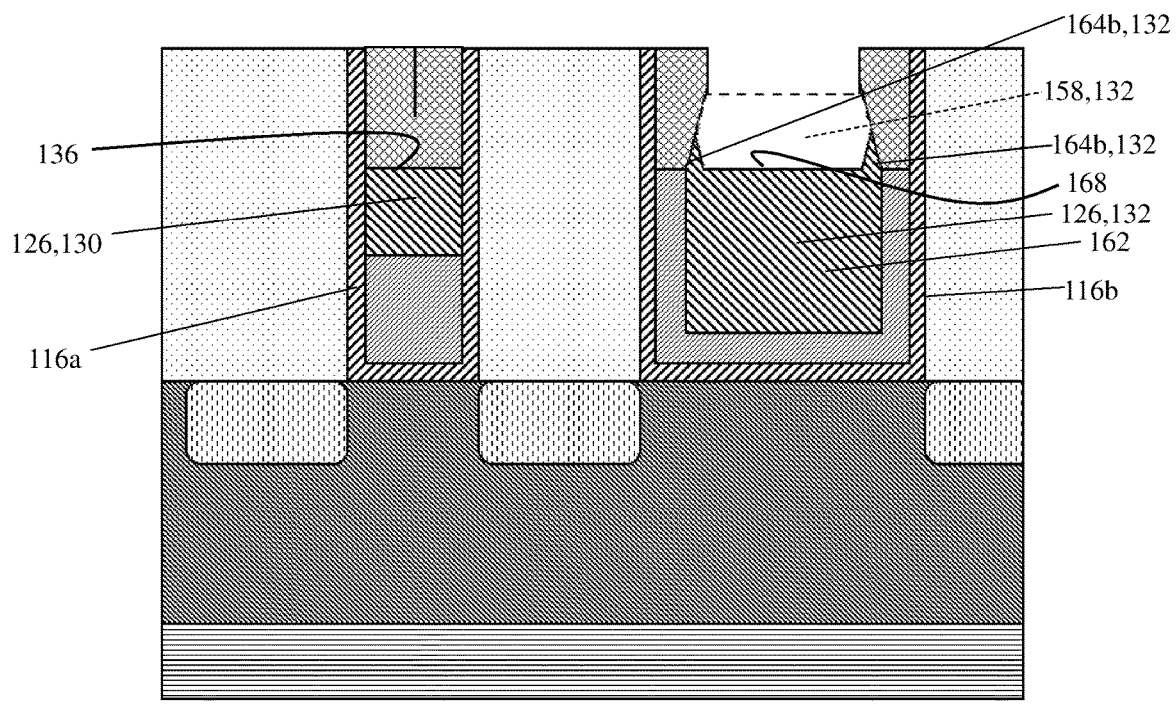
FIG. 7 shows removing a portion of the exposed first fill material from the trench of FIG. 6, according to embodiments of the disclosure.

Turning to FIG. 7, in contrast to conventional processes, a portion 158 (in phantom) of remainder 132 of first fill material 126 may be removed from within second trench 116b. Portion 158 (in phantom) may be removed by any suitable process such as selective etching of first fill material 126. As mentioned above, portion 158 (in phantom) may be removed to allow for additional fill material to be formed in second trench 116b. For example, as will be discussed later herein, additional fill material may be subsequently formed in second trench 116b to replace portion 158 (in phantom). As also shown in FIG. 7, first portion 150 of second fill material 140 may cover and/or protect remainder 130 of first fill material 126 during the removal of portion 158 (in phantom) from second trench 116b.

In contrast to conventional processes, after portion 158 (in phantom) is removed, remainder 132 of first fill material 126 in second trench 116b may include a lower portion 162 and two upper portions 164a,b positioned on lower portion 162. An upper surface 168 of lower portion 162 of remainder 132 in second trench 116b may be substantially co-planar with upper surface 136 of remainder 130 in first trench 116a. Additionally, two upper portions 164a,b of first fill material 126 in second trench 116b may be positioned above upper surface 136 of remainder 130 of first fill material 126 of in first trench 116a. Lower portion 162 may have a substantially rectangular cross-sectional geometry and upper portions 164a,b may have substantially triangular cross-sectional geometries. Upper portions 164a,b protrude upwardly from lower portion 162, e.g., at upper edges thereof. As shown in FIG. 7 by the substantially co-planar upper surfaces 136 and 168, the method according to embodiments of the disclosure may mitigate the conventionally disproportionate removal of a first fill material, such as an RMG tungsten body, from trenches having different widths.

Figure 8:
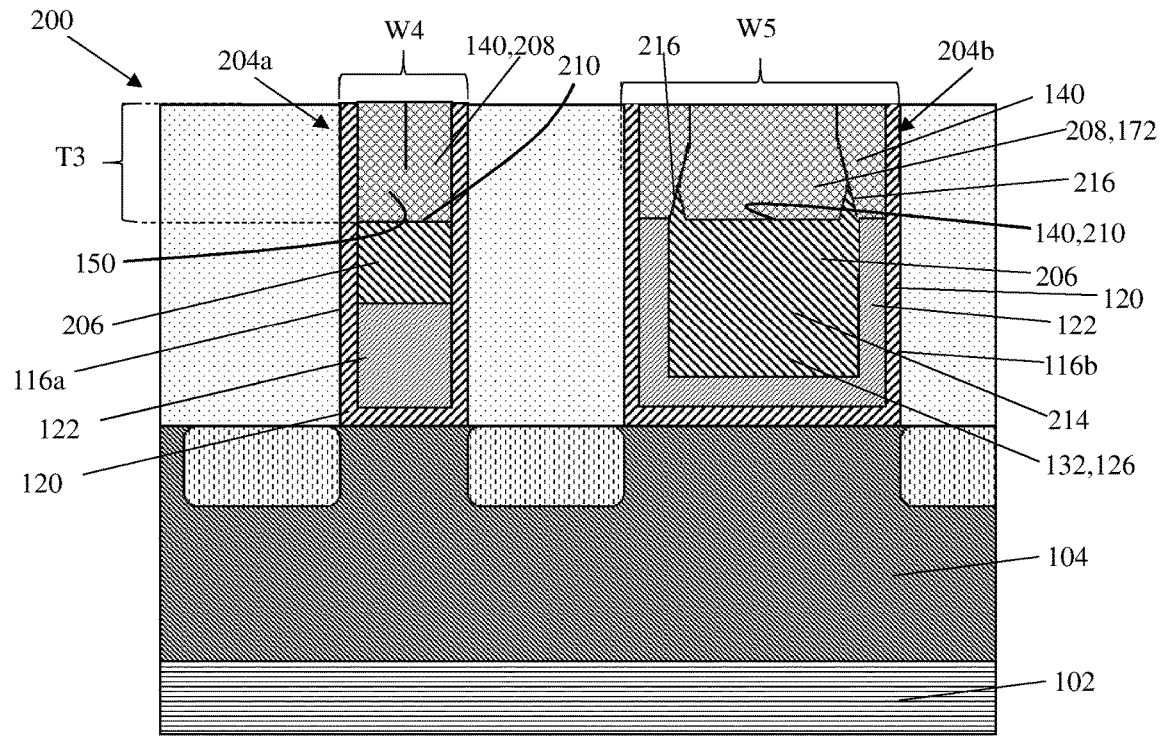
FIG. 8 shows forming a third fill material over the first fill material in the trench of FIG. 7, according to embodiments of the disclosure.

Turning next to FIG. 8, in further contrast to conventional processes, a third fill material 172 may be formed on remainder 132 of first fill material 126 in second trench 116b after removing portion 158 (FIG. 7). Third fill material 172 may include the same or a different material as second fill material 140. Third fill material 172 may include a cap material for electrically insulating an RMG structure. For example, third fill material 172 may include a cap material such silicon nitride (SiN) and/or any other suitable material to protect and/or isolate an RMG structure. Third fill material 172 may be formed by any suitable semiconductor process such as deposition and CMP. As discussed above with respect to first fill material 126 and second fill material 140, although discussed herein with respect to a RMG structure for a transistor, it is understood that third fill material 172 may include any desirable semiconductor fill material.

In contrast to structures formed by the methods described herein, structures formed by conventional fill material formation processes may include first fill material 126 in trenches 116a,b having different heights as shown in FIG. 4. As discussed above, the methods described herein allow for another portion (e.g., portion 158 in phantom of FIG. 7) of first fill material 126 within a wider trench (e.g., second trench 116b) to be removed to make the upper surfaces of first fill material 126 in each trench substantially co-planar. The methods described herein may mitigate disproportionate removal first fill material 126 in different sized trenches, allowing for first fill material 126 to extend to similar levels within the trenches.

In contrast to structures formed by the methods described herein, structures formed by conventional processes generally include a thinner second fill material above first fill material 126 in wider trenches (e.g., second trench 116b) which may be more readily removed during subsequent processing. In the example where first fill material 126 includes a tungsten (W) body for an RMG structure and second fill material 140 includes a cap structure, conventional structures may therefore be more susceptible to shorting of wider RMG structures. As shown in FIG. 8, the methods described herein may allow for a thicker third fill material 172 having a similar thickness as second fill material 140 to be formed in on first fill material 126 in wider second trench 116b. In the example where first fill material 126 is a W body for an RMG structure and third fill material 172 is a cap structure, the methods described herein may mitigate and/or prevent shorting of wider RMG structures in an integrated circuit.

FIG. 8 also shows an integrated circuit (IC) structure 200 formed according to embodiments of the disclosure. IC structure 200 may include two or more adjacent RMG structures 204a,b for transistors of the IC structure. The RMG structures 204a,b may be positioned in an ILD 110 on a fin 104 on a substrate 102. First RMG structure 204a may have a smaller width W4 as compared to a width W5 of the second RMG structure 204b. Each RMG structure 204a,b may include: a gate dielectric layer 120; a metal gate material layer 122 positioned on a lower portion of the liner; a tungsten (W) body 206 positioned on metal gate material layer 122; and a cap structure 208 positioned on W body 206. As discussed above, conventional RMG structures having different widths generally include a thinner cap structure on the wider RMG structure which may result in the thinner cap structure being removed, exposing the tungsten gate body during subsequent processing, for example, during the formation of contact structures (not shown) to substrate 102, fin 104, and/or RMG structure 204a,b. As shown in FIG. 8, in contrast to conventional RMG structures, while RMG structures 204a,b have different widths W4, W5, respectively, an upper surface 210 of each W body 206 may be substantially co-planar with one another. As also shown in FIG. 8, in contrast to conventional RMG structures, forming RMG structures 204a,b to have W bodies 206 including substantially co-planar upper surfaces 210 may allow for cap structures 208 of the RMGs to have a substantially similar thickness T3. As further shown in FIG. 8, in contrast to conventional RMG structures, second RMG structure 204b may include a tungsten gate body 206 having a lower portion 214 and two upper portions 216. Lower portion 214 may have a substantially rectangular cross-sectional geometry and two upper portions 216 may have a substantially triangular cross-sectional geometry.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the terms "first," "second," and the like, do not denote any order, quantity, or importance, but rather are used to distinguish one element from another. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure. As used herein, the term "substantially U-shaped" may refer to a shape having three major line segments in the shape of the letter 'U' but with some variation in the shape of the segments and/or the number of minor line segments. As used herein, the term "substantially rectangular" may refer to a shape having four major line segments in the shape of a rectangle but with some variation in the shape of the segments and/or the number of minor line segments. As used herein, the term "substantially square" may refer to a shape having four major line segments in the shape of a square but with some variation in the shape of the segments and/or the number of minor line segments. As used herein, the term "substantially triangular" may refer to a shape having three major line segments in the shape of a triangle but with some variation in the shape of the segments and/or the number of minor line segments.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
    forming a first fill material in a first trench and a second trench, the first and second trench positioned in a dielectric material on a substrate, and a width of the first trench being greater than a width of the second trench, wherein the first fill material is positioned on a gate metal in the first trench, wherein a cross-sectional geometry of the gate metal in the first trench is substantially U-shaped;
    removing a first portion of the first fill material from the first trench and the second trench;
    forming a second fill material above a remaining portion of the first fill material in the first trench and the second trench, wherein the second fill material is positioned on a gate metal in the second trench such that the second fill material completely fills at least the second trench wherein a cross-sectional geometry of the gate metal in the second trench is rectangular;
    removing a first portion of the second fill material in the first trench to expose an upper surface of the remaining portion of the first fill material in the first trench; and
    removing a portion of the remaining portion of the first fill material in the first trench such that the remaining portion of the first fill material in the first trench includes:
        a lower region having an uppermost extent that is substantially co-planar with an upper surface of the remaining portion of the first fill material in the second trench, and
        two upper regions positioned on the lower region.

2. The method of claim 1, wherein after removing the first portion of the first fill material, an upper surface of the remaining portion of the first fill material in the first trench is positioned above the upper surface of the remaining portion of the first fill material in the second trench.

3. The method of claim 1, wherein the two upper region have an uppermost extent that is positioned above the upper surface of the second portion of the first fill material in the second trench.

4. The method of claim 1, wherein after removing the first portion of the second fill material, the remaining portion of the first fill material in the second trench remains covered by the second fill material.

5. The method of claim 1, wherein a thickness of the second fill material is approximately half of the width of the second trench.

6. The method of claim 1, wherein the first fill material has a different material composition than the second fill material.

7. The method of claim 1, wherein the removing the portion of the remaining portion of the first fill material in the first trench includes an etching process that is selective to the first fill material.

8. The method of claim 1, further comprising after removing the portion of the remaining portion of the first fill material in the first trench, forming a third fill material above the first fill material in the first trench.

9. The method of claim 8, wherein the second fill material is the same as the third fill material.

10. The method of claim 1, wherein first fill material is a metal for a metal gate electrode, and wherein the second fill material is an insulator for a cap for the metal gate electrode.

11. A semiconductor structure comprising:
a dielectric material positioned above a substrate;
a first fill material in a first trench in the dielectric material, the first fill material including:
a lower portion; and
two upper portions positioned on the lower portion, wherein an uppermost extent of the two upper portions is positioned below an uppermost extent of the first trench;
a second fill material in a second trench in the dielectric material, the second fill material laterally separated from the first fill material, and the second fill material having an uppermost extent positioned below an uppermost extent of the second trench,
wherein the first fill material is positioned on a gate metal in the first trench, and wherein the second fill material is positioned on a gate metal in the second trench,
wherein a cross-sectional geometry of the gate metal in the first trench is substantially U-shaped, and wherein a cross-sectional geometry of the gate metal in the second trench is substantially rectangular,
wherein a width of the lower portion of the first fill material is greater than a width of the second fill material, and
wherein the upper surface of the lower portion of the first fill material is substantially co-planar with the uppermost extent of the second fill material;
a third fill material positioned above the first fill material in the first trench; and
a fourth fill material positioned above the second fill material in the second trench.

12. The semiconductor structure of claim 11, wherein the lower portion has a substantially rectangular cross-sectional geometry, and wherein the two upper portions each have a substantially triangular cross-sectional geometry.

13. The structure of claim 11, wherein an upper surface of the fourth fill material is substantially co-planar with an upper surface of the third fill material.

14. The semiconductor structure of claim 11, wherein the substrate includes a fin structure, and wherein the first fill material and the second fill material are positioned in a dielectric material on the fin structure.

* * * * *